(12) United States Patent
Sasaki et al.

(10) Patent No.: US 9,406,622 B2
(45) Date of Patent: Aug. 2, 2016

(54) ELECTRONIC CIRCUIT AND SEMICONDUCTOR COMPONENT

(71) Applicant: KABUSHIKI KAISHA TOSHIBA, Minato-ku (JP)

(72) Inventors: Tadahiro Sasaki, Tokyo (JP); Kazuhiko Itaya, Kanagawa (JP); Hiroshi Yamada, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 180 days.

(21) Appl. No.: 13/951,894

(22) Filed: Jul. 26, 2013

(65) Prior Publication Data

US 2014/0029227 A1    Jan. 30, 2014

(30) Foreign Application Priority Data

Jul. 27, 2012 (JP) ................. 2012-167662

(51) Int. Cl.
*H05K 7/00* (2006.01)
*H01L 23/552* (2006.01)
*H01L 25/065* (2006.01)
*H01L 23/00* (2006.01)

(52) U.S. Cl.
CPC .............. *H01L 23/552* (2013.01); *H01L 24/19* (2013.01); *H01L 24/96* (2013.01); *H01L 25/0655* (2013.01); *H01L 24/16* (2013.01); *H01L 2224/16225* (2013.01); *H01L 2224/24137* (2013.01); *H01L 2924/1431* (2013.01); *H01L 2924/1434* (2013.01); *H01L 2924/15311* (2013.01); *H01L 2924/18162* (2013.01); *H01L 2924/19041* (2013.01); *H01L 2924/19042* (2013.01); *H01L 2924/19043* (2013.01); *H01L 2924/19105* (2013.01)

(58) Field of Classification Search
USPC ................. 361/783, 760; 257/659
See application file for complete search history.

(56) References Cited

U.S. PATENT DOCUMENTS 7,848,108 B1    12/2010  Archambeault et al.
2007/0289771 A1*  12/2007  Osaka ................. H01L 23/66
                                                        174/250

(Continued)

FOREIGN PATENT DOCUMENTS

JP    2009-200274 A    9/2009
JP    2009-218966      9/2009

(Continued)

OTHER PUBLICATIONS

Office Action issued Jun. 17, 2014 in Japanese Patent Application No. 2012-167662 (with English language translation).

(Continued)

*Primary Examiner* — Andargie M Aychillhum
(74) *Attorney, Agent, or Firm* — Oblon, McClelland, Maier & Neustadt, L.L.P

(57) ABSTRACT

A circuit board according to an embodiment is one in which a plurality of electronic components is mounted on a printed wiring board. The circuit board includes a semiconductor component that is mounted on the printed wiring board, and the semiconductor component includes a semiconductor device and a first EBG structure formed on or above the semiconductor device. An operating frequency of the semiconductor device exists outside a cutoff band of the first EBG structure, and the first EBG structure is connected to a ground or a power supply of the printed wiring board.

11 Claims, 4 Drawing Sheets

(56) References Cited

U.S. PATENT DOCUMENTS

| | | | |
|---|---|---|---|
| 2009/0206444 A1* | 8/2009 | Yamada et al. | 257/506 |
| 2012/0032865 A1* | 2/2012 | Toyao et al. | 343/835 |

FOREIGN PATENT DOCUMENTS

| | | |
|---|---|---|
| JP | 2010-141173 A | 6/2010 |
| JP | 2011-040742 A | 2/2011 |
| JP | 2011-181730 | 9/2011 |
| JP | 2012-138644 A | 7/2012 |
| WO | WO 2011/068238 A1 | 6/2011 |
| WO | WO 2011/070735 A1 | 6/2011 |

OTHER PUBLICATIONS

U.S. Appl. No. 14/183,720, filed Feb. 19, 2014, Sasaki, et al.
Office Action issued Aug. 18, 2015 in Japanese Patent Application No. 2014-252363 (with English language translation).
U.S. Appl. No. 13/677,840, filed Nov. 15, 2012, Tadahiro Sasaki, et al.

* cited by examiner

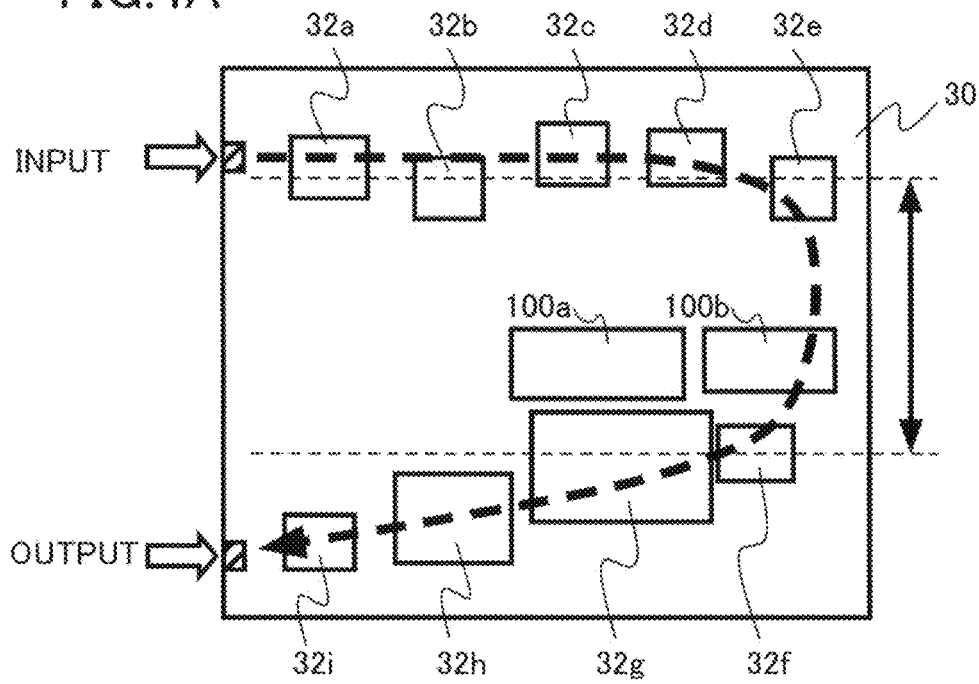
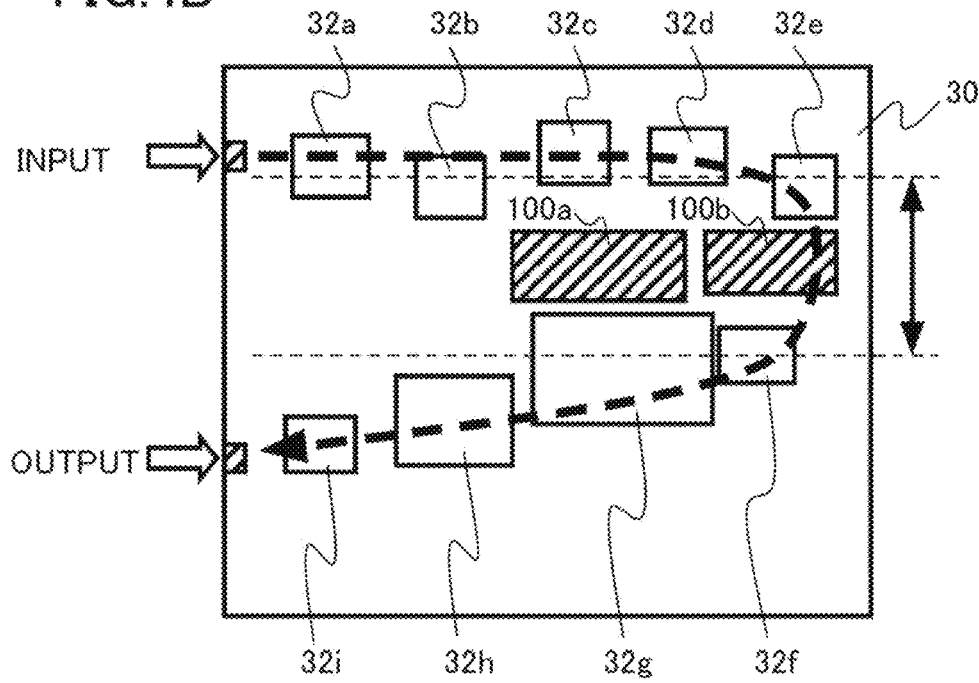

ELECTRONIC CIRCUIT AND SEMICONDUCTOR COMPONENT

CROSS-REFERENCE TO RELATED APPLICATION

This application is based upon and claims the benefit of priority from Japanese Patent Application No. 2012-167662, filed on Jul. 27, 2012, the entire contents of which are incorporated herein by reference.

FIELD

Embodiments described herein relate generally to an electronic circuit and a semiconductor component.

BACKGROUND

In a circuit board of a motherboard or module on which electronic components such as a semiconductor component are mounted, sometimes a malfunction occurs. The malfunction may be generated by inter-device mutual interference caused by electromagnetic wave due to a circuit operation. The malfunction may also be generated by a noise that propagates on a ground surface or a power supply surface. The malfunction of the circuit board, which is caused by the mutual interference or the noise, emerges particularly in the case that the circuit board is downsized, namely, a mounting layout area of the electronic component is reduced.

In order to prevent the malfunction of the circuit board, which is caused by the mutual interference or the noise, for example, a distance between the mounted electronic components may be increased, or a filter circuit in which an electronic component is used is added to the circuit board. However, the increase of the distance between the electronic components or the addition of the filter circuit obstructs the downsizing of the circuit board.

On the other hand, there is adopted a method for covering the semiconductor component subject to the electromagnetic wave or a whole electronic circuit on the circuit board subject to the electromagnetic wave using a metallic casing. The semiconductor component or the electronic circuit is physically protected by the method, and the harmful electromagnetic wave from the outside is cut off by the method.

An EBG (Electromagnetic Band Gap) structure provided in a dielectric circuit board is proposed, because an effect to reduce a circuit area is enhanced compared with the filter circuit in which the electronic component such as semiconductor device is used.

BRIEF DESCRIPTION OF THE DRAWINGS

FIGS. 4A and 4B are views illustrating actions of the semiconductor component and the circuit board of the first embodiment.

DETAILED DESCRIPTION

Figure 1A:
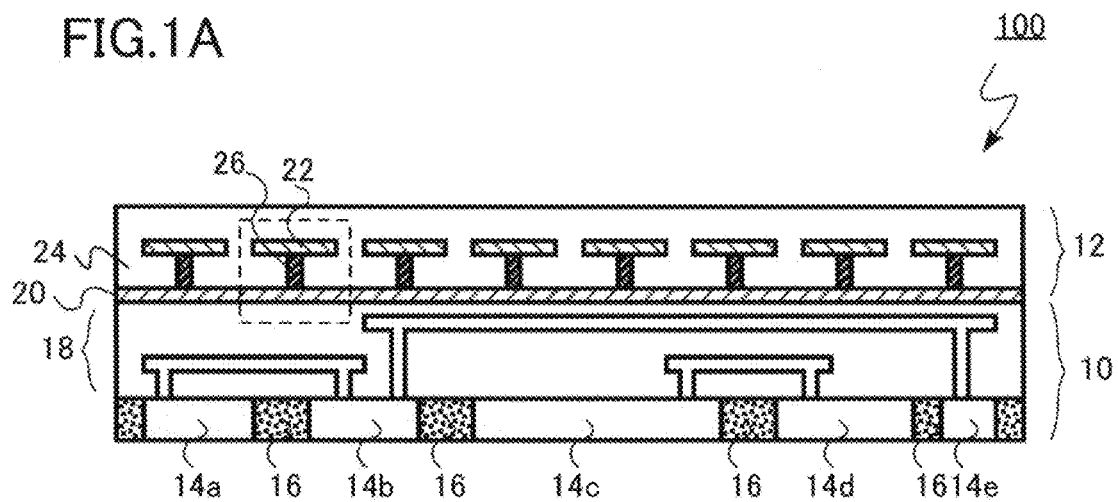
FIGS. 1A and 1B are schematic diagrams illustrating a semiconductor component according to a first embodiment.

A circuit board according to an embodiment in which a plurality of electronic components is mounted on a printed wiring board, the circuit board includes a semiconductor component that is mounted on the printed wiring board, the semiconductor component including a semiconductor device and a first EBG structure formed on or above the semiconductor device, wherein an operating frequency of the semiconductor device exists outside a cutoff band of the first EBG structure, and the first EBG structure is connected to a ground or a power supply of the printed wiring board.

As used herein, the "semiconductor device" is a concept that includes not only a semiconductor chip including an SOC (system on chip) but also a semiconductor component, what is called a pseudo SOC (pseudo system on chip), in which a plurality of semiconductor chips is bonded using resin to connect chips by a wiring layer.

The "semiconductor component" is a concept that includes not only a semiconductor package in which the semiconductor device is sealed but also what is called a bare chip in a state in which the semiconductor device is not sealed.

The "electronic component" is a concept that includes electronically functioning whole components, such as the semiconductor component and such passive components as an antenna, a capacitor, and a resistor.

The "printed wiring board" means a board in which a conductive printed wiring is formed and what is called a bare board on which the electronic component is not mounted.

The "circuit board" means a board in a state in which the electronic component is mounted on the printed wiring board.

The "cutoff band" of the EEG structure is defined by a frequency band in which, for example, S21 that is of an S parameter indicating an insertion loss is less than or equal to −20 dB, namely, a cutoff amount (the insertion loss) is greater than −20 dB.

First Embodiment

A semiconductor component according to a first embodiment is a one that includes a semiconductor device and a first EEG structure formed on the semiconductor device. An operating frequency of the semiconductor device exists outside a cutoff band of the first EBG structure.

A circuit board of the first embodiment is one in which a plurality of electronic components is mounted on a printed wiring board. The circuit board includes the semiconductor component that includes the semiconductor device and the first EBG structure formed on or above the semiconductor device. The operating frequency of the semiconductor device exists outside the cutoff band of the first EBG structure. The first EBG structure is connected to the ground or the power supply of the printed wiring board.

The ground of the printed wiring board means a ground surface or a ground wiring, or a ground potential provided to the ground surface or the ground wiring. The power supply of the printed wiring board means a power supply surface or power supply wiring, or a power supply potential provided to the power supply surface or power supply wiring.

The semiconductor component of the first embodiment having the above configuration is mounted on the printed wiring board to connect the ground or the power supply to the first EBG structure, whereby the ground or the power supply of the circuit board is stabilized without providing a specific filter circuit. Accordingly, use of the semiconductor component can form the circuit board in which downsizing and prevention of a malfunction caused by mutual interference or a noise of an device are balanced.

The semiconductor component of the first embodiment having the above configuration stabilizes the ground or the power supply of the circuit board while the new electronic component needs not to be mounted on the printed wiring board to provide the filter circuit. Accordingly, the circuit board in which the downsizing and the prevention of the malfunction caused by the mutual interference or the noise of the device are balanced can be constructed.

In the semiconductor component of the first embodiment, the first EBG structure includes the cutoff band different from the operating frequency of the semiconductor device, so that not only an electromagnetic wave harmful to the semiconductor component itself but also an electromagnetic wave of a frequency band harmful to the circuit board on which the semiconductor component is mounted can be cut off.

Figure 1B:
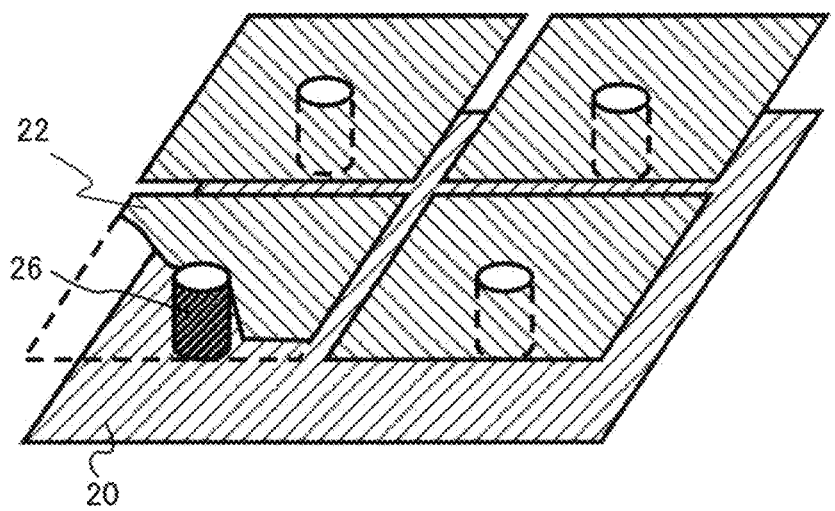

FIGS. 1A and 1B are schematic diagrams illustrating the semiconductor component of the first embodiment; FIG. 1A is a schematic sectional view of the semiconductor component, and FIG. 1B is a schematic perspective view of the first EBG structure.

A semiconductor component 100 includes a semiconductor device 10 and a first EBG structure 12 formed on the semiconductor device 10. The case that the semiconductor device 10 is a semiconductor component, what is called a pseudo SOC (pseudo system on chip) in which a plurality of semiconductor chips is bonded using resin to connect the semiconductor chips to each other by a wiring layer will be described by way of example.

The pseudo SOC 10 includes a plurality of semiconductor chips 14a to 14e. The semiconductor chips 14a to 14e are bonded using resins 16. For example, the semiconductor chips 14a to 14e are electrically connected to one another by a multi-layer wiring layer 18.

The first EBG structure 12 is provided above the pseudo SOC 10. In FIG. 1A, a region surrounded by a dotted line constitutes one unit of the first EBG structure 12. The first EBG structure 12 has a configuration in which the units are regularly disposed.

FIG. 1B is a schematic perspective view of the first EBG structure 12 of the first embodiment. The first EBG structure 12 includes an electrode 20 made of a first conductor and a patch unit 22, which is provided in substantially parallel with the electrode 20 and made of a second conductor. The first EBG structure 12 also includes an insulating layer 24 provided between the electrode 20 and the patch unit 22. The first EBG structure 12 also includes a via 26 connecting the electrode 20 and the patch unit 22. The first EBG structure 12 has what is called a mushroom structure.

The electrode 20 is a reference surface, and constitutes a ground surface or a power supply surface, for example. The electrode 20 is connected to the ground or the power supply of the printed wiring board when the semiconductor component 10 is mounted on the printed wiring board. For example, the first conductor is metals such as aluminum (Al) or gold (Au).

The patch unit 22 is made of a second conductor. For example, the second conductor is metals such as aluminum (Al) or gold (Au). There is no particular limitation to a shape of the patch unit 22, but the patch unit 22 may be formed into a square shape, a circular shape, or other shapes.

A size of the patch unit 22 is optimized in order to obtain a desired cutoff band (stop band region). From the viewpoint of reducing the size of the semiconductor component, desirably the size of the patch unit 22 is less than or equal to 10 mm squares.

For example, the insulating layer 24 is made of organic resin.

The via 26 is made of a conductor. There is no particular limitation to the conductor, the conductor may be metal, semiconductor, or conductive resin. The via 26 is provided between the patch unit 22 and the electrode 20 in the insulating layer 24, and connected to the patch unit 22 and the electrode 20.

Figure 2:
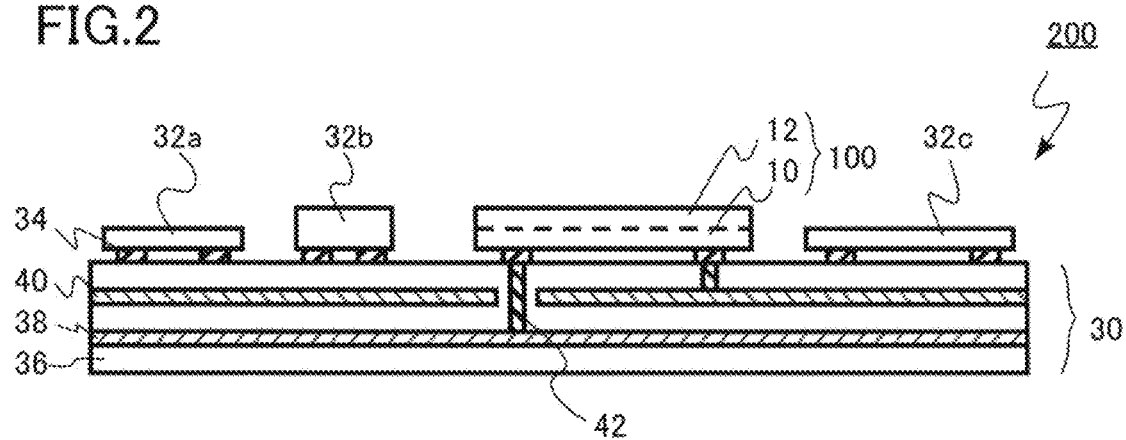
FIG. 2 is a schematic sectional view illustrating a circuit board on which the semiconductor component of the first embodiment is mounted.

FIG. 2 is a schematic sectional view illustrating a circuit board 200 on which the semiconductor component 10 of the first embodiment is mounted. In the circuit board 200, a plurality of electronic components 32a, 32b, and 32c and the semiconductor component 100 are mounted on a printed wiring board 30. The electronic components 32a, 32b, and 32c are semiconductor components such as a logic LSI and a memory or passive components such as a capacitor, a resistor, and a coil. The electronic components 32a, 32b, and 32c and the semiconductor component 100 are mounted on the printed wiring board 30 with bumps 34, for example, interposed therebetween. For example, the circuit board 200 is a motherboard.

The printed wiring board 30 has a structure in which a resin insulating layer 36, a metallic ground surface 38, and a metallic power supply surface 40 are stacked, for example. In the insulating layer 36, a through via 42 is provided, and the ground surface 38 or the power supply surface 40 can be connected to the semiconductor component 100 or the electronic components 32a, 32b, and 32c. FIG. 2 illustrates a section in which the ground surface 38 and the semiconductor product 100 are connected to each other through the through via 42 and the bumps 34.

The semiconductor component 100 includes the semiconductor device 10 and the first EBG structure 12. The semiconductor component 100 is mounted such that the first EBG structure 12 is located on the opposite side to the printed wiring board 30 with respect to the semiconductor device 10. Therefore, the first EBG structure 12 also acts as a physical protective layer for the semiconductor device. That is, the first EBG structure 12 has a function as a casing of the semiconductor device 10.

For example, the electrode 20 of the first EBG structure 12 is electrically connected to the ground surface 38 of the printed wiring board 30. The first EBG structure 12 is designed such that the operating frequency of the semiconductor device 10 exists outside the cutoff band of the first EBG structure 12, and such that the operating frequency (transmission frequency) of the circuit board 200 exists in the cutoff hand of the first EBG structure 12.

The first EBG structure 12 cuts off the operating frequency (transmission frequency) of the circuit board 200 to act as a stop band filter that cuts off the frequency harmful to the operation of the circuit board 200. In the circuit board 200 of the first embodiment, an upper region of the semiconductor component 100 mounted on the circuit board 200, namely, a dead space is used as the filter circuit for the circuit board 200. Therefore, the necessity to separately provide the filter circuit including the electronic components in the circuit board 200 is eliminated to implement downsizing of the circuit board 200.

The first EBG structure 12 is designed such that the TO operating frequency of the semiconductor device 10 exists outside the cutoff band of the first EBG structure 12, and such that the operating frequency (transmission frequency) of the circuit board 200 exists in the cutoff band of the first EBG structure 12. For this reason, although an effect that the first EBG structure 12 stabilizes the operation of the semiconductor device 10 itself is not too large, an influence of the electromagnetic wave of the cutoff band of the first EBG structure 12 on the semiconductor device 10 can be reduced.

Figure 3:
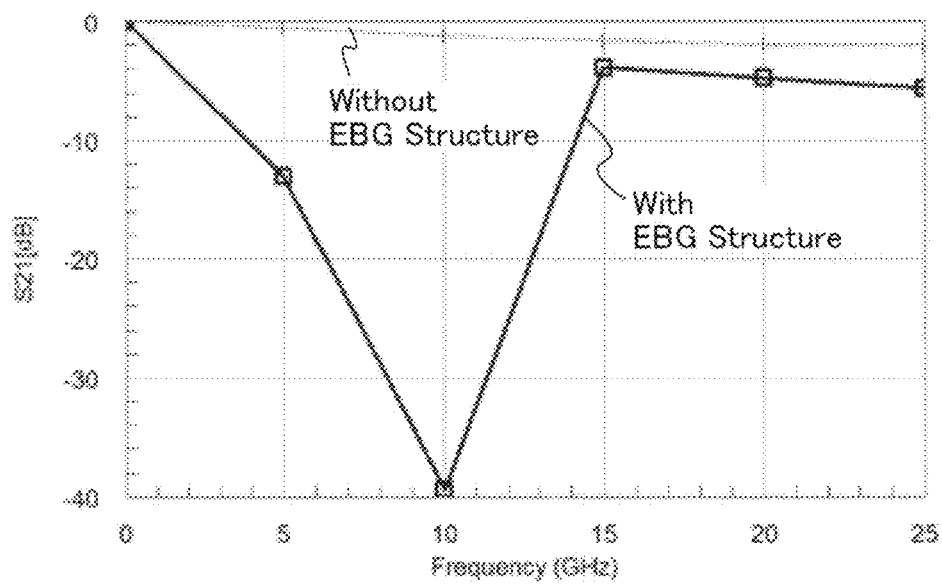
FIG. 3 is a view illustrating an electromagnetic analysis result of the first embodiment.

FIG. 3 is a view illustrating an electromagnetic analysis result of the circuit board of the first embodiment. The electromagnetic analysis result is obtained by a simulation. In the first EEC structure 12, the patch unit 22 has the size of 3 mm squares, and the patch units 22 are arrayed at intervals of 1 mm in a 5-by-5 matrix. The patch unit 22 is connected to the electrode 20 that is of the reference surface through the via 26 having a length of 0.5 mm. The electrode 20 is connected to the ground surface 38 of the printed wiring board 30 on which the semiconductor product 100 is mounted.

In FIG. 3, a horizontal axis indicates the frequency of the transmission signal, and a vertical axis indicates an S parameter (S21). A dotted line indicates a characteristic of the case that the mounted semiconductor product 100 does not include the first EBG structure 12, and a solid line indicates a transmission characteristic of the case that the semiconductor product 100 includes the first EBG structure 12.

As indicated by the dotted line, in the case that the first EBG structure 12 does not exist, for example, only the insertion loss of −1 dB at the frequency of 10 GHz. Accordingly, for example, in the case that a noise of 10 GHz is mixed on the ground surface of the printed wiring board 30, the noise cannot be cut off.

On the other hand, as indicated by the solid line, in the case that the first EBG structure 12 exists, the first EBG structure 12 acts as the stop band filter having a cutoff amount of −40 dB at the frequency of 10 GHz for the circuit board 200. Accordingly, for example, in the case that the circuit hoard 200 has the operating frequency of 10 GHz, the first EBG structure 12 constitutes the stop band filter that cuts off the frequency harmful to the operation of the circuit board 200.

FIGS. 4A and 4B are views illustrating actions of the semiconductor component and the circuit board of the first embodiment. FIG. 4A is a schematic plan view illustrating the circuit board in the case that the first EBG structure 12 does not exist in the semiconductor component, and FIG. 4B is a schematic plan view illustrating the circuit board in the case that the first EBG structure 12 exists in the semiconductor component.

As illustrated in FIG. 4A, electronic components 32a, 32b, 32c, 32d, 32e, 32f, 32g, 32h, and 32i and semiconductor components 100a and 100b are mounted on the printed wiring board 30 to form the circuit board. In the circuit board, in order to control the mutual interference of the signal, the electronic components are disposed in consideration of a signal flow from an input to an output indicated by a dotted-line arrow in FIG. 4A. Therefore, the electronic components go a long way around such that the interference is not generated by the signal. Accordingly, in FIG. 4A, the electronic components 32a, 32b, 32c, 32d, and 32e located on the upper side and the electronic components 32f, 32g, 32h, and 32i located on the lower side are separated from each other by a solid-line two-headed arrow.

On the other hand, in FIG. 4B, the first EBG structure 12 is provided above the semiconductor components 100a and 100b as shown in FIG. 1A, and disposed in a place where the interference between the electronic components is predicted to be generated by the noise propagating on the ground surface. For example, the first EBG structure 12 is connected to the ground of the printed wiring board. This enables the semiconductor components 100a and 100b to cut off the noise propagating on the ground surface from the electronic components 32a, 32b, 32c, 32d, and 32e located on the upper side in FIG. 4B. Accordingly, in FIG. 4B, the distance between the electronic components 32a, 32b, 32c, 32d, and 32e located on the upper side and the electronic components 32f, 32g, 32h, and 32i located on the lower side can be shortened compared with the case in FIG. 4A.

The first EBG structure 12 formed on the semiconductor device 10 acts as the stop band filter of the circuit board 100, which allows the cutoff of the noise propagating on the ground surface of the circuit board 100. The distance between the electronic components mounted on the circuit board can thus be shortened. Therefore, the downsizing of the circuit board can be implemented.

In the first embodiment, the pseudo SOC is used as the semiconductor device 10, so that the first EBG structure 12 can be formed through the same process as the multi-layer wiring layer 18 of the pseudo SOC using the same material. Accordingly, advantageously the first EBG structure 12 can simply be formed in the semiconductor component 100.

The semiconductor device 10 is not necessarily limited to the pseudo SOC, but the semiconductor device 10 may be the SOC, the single logic LSI, or the memory. In this case, for example, the first EBG structure 12 is not formed through the same process as the semiconductor device 10, but the first EBG structure 12 may be formed through the process of bonding the semiconductor device 10 and the first EBG structure 12, which are separately formed.

In the first embodiment, by way of example, the first EBG structure 12 is connected to the ground surface 38 of the printed wiring board 30. Alternatively, the first EBG structure 12 may be connected to the power supply surface 40 of the printed wiring board 30 to cut off the noise of the power supply surface 40.

Alternatively, a two-layer structure is formed by stacking two EBG structures similar to the first EBG structure, and one of the EBG structures may be connected to the ground surface 38 of the printed wiring board 30 while the other EBG structure is connected to the power supply surface 40.

In the first embodiment, by way of example, the first EBG structure 12 has the mushroom structure. Although preferably the first EBG structure 12 has the mushroom structure from the viewpoint of obtaining the good cutoff characteristic, other structures such as a via-less mosaic structure may be used.

Second Embodiment

A semiconductor component and a circuit board according to a second embodiment differ from those of the first embodiment in that the semiconductor component includes a second EEG structure between the first EBG structure and the semiconductor device and that the operating frequency of the semiconductor device exists in the cutoff band of the second EBG structure. Accordingly, the overlapping description with the first embodiment is omitted.

Figure 5A:
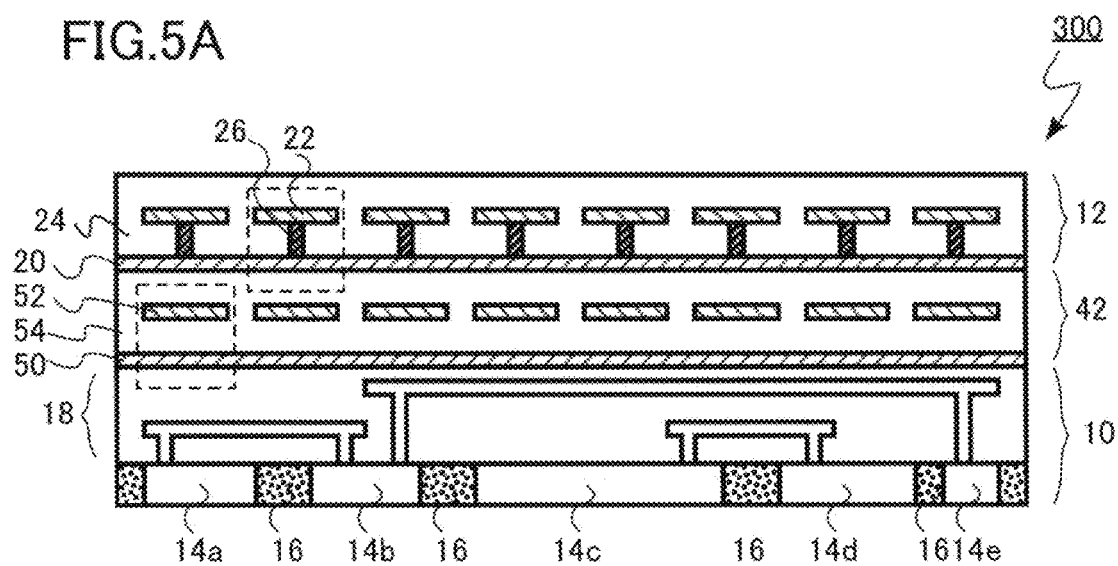
FIGS. 5A and 5B are schematic diagrams illustrating a semiconductor component according to a second embodiment.
Figure 5B:
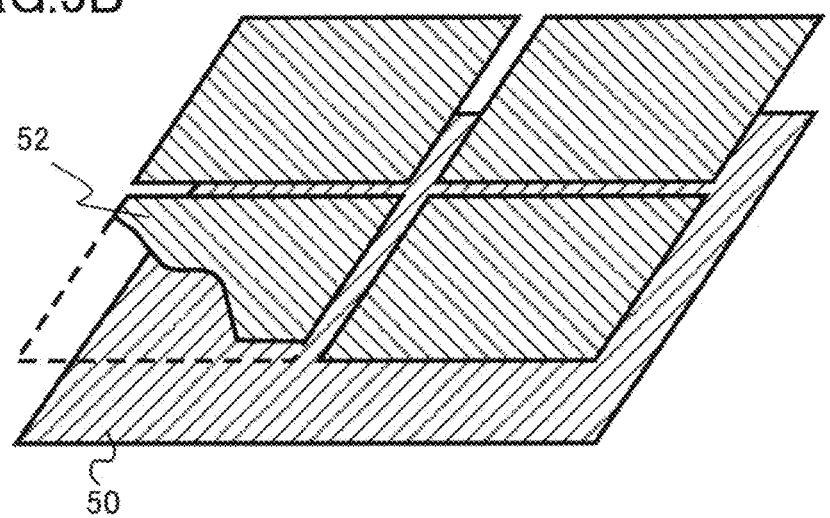

FIG. 5 is a schematic diagram illustrating the semiconductor component of the second embodiment. FIG. 5A is a schematic sectional view of the semiconductor component, and FIG. 5B is a schematic perspective view of the second EBG structure.

A semiconductor component 300 includes the semiconductor device 10, a second EBG structure 42 formed on the semiconductor device 10, and the first EBG structure 12 formed on the second EBG structure 42. That is, the second embodiment differs from the first embodiment in that the semiconductor component 300 includes the second EBG structure 42 between the first EBG structure 12 and the semiconductor device 10.

The case that the semiconductor device 10 is the semiconductor component, what is called the pseudo SOC (pseudo system on chip) in which the a plurality of semiconductor chips is bonded using the resin to connect the semiconductor chips to each other by the wiring layer will be described by way of example.

The pseudo SOC 10 includes the a plurality of semiconductor chips 14a to 14e. The semiconductor chips 14a to 14e are bonded using resins 16. For example, the semiconductor chips 14a to 14e are electrically connected to one another by the multi-layer wiring layer 18.

The second EBG structure 42 is provided above the pseudo SOC 10. In FIG. 5A, a lower-side region surrounded by the dotted line constitutes one unit of the second EBG structure 42. The second EBG structure 42 has the configuration in which the units are regularly disposed.

The first EBG structure 12 is provided above the second EBG structure 42. In FIG. 5A, an upper-side region surrounded by the dotted line constitutes one unit of the first EBG structure 12. The first EBG structure 12 has the configuration in which the units are regularly disposed.

FIG. 5B is a schematic perspective view of the second EBG structure of the second embodiment. The second EBG structure 42 includes an electrode 50 made of the first conductor and a patch unit 52, which is provided in substantially parallel with the electrode 50 and made of the second conductor. The first EBG structure 12 includes the insulating layer 24 provided between the electrode 20 and the patch unit 22. The second EBG structure 42 has what is called a via-less mosaic structure.

The electrode 50 is the reference surface, and constitutes the ground surface or the power supply surface. The electrode 50 is connected to the ground or the power supply of the printed wiring board when the semiconductor component 10 is mounted on the printed wiring board. For example, the first conductor is metals such as aluminum (Al) or gold (Au).

The patch unit 52 is made of the second conductor. For example, the second conductor is metals such as aluminum (Al) or gold (Au). There is no particular limitation to the shape of the patch unit 52, but the patch unit 52 may be formed into the square shape, the circular shape, or other shapes. For example, the patch units 52 may be connected by a bridge line.

The size of the patch unit 52 is optimized in order to obtain the desired cutoff band (stop band region). From the viewpoint of reducing the size of the semiconductor component, desirably the size of the patch unit 52 is less than or equal to 10 mm squares.

For example, the insulating layer 24 is made of organic resin.

The semiconductor component 300 of the second embodiment is configured such that the operating frequency of the semiconductor device 10 exists in the cutoff hand of the second EBG structure 42. Accordingly, the second EBG structure 42 acts as the stop band filter that cuts off the frequency band harmful to the operation of the semiconductor device 10.

In the case that the semiconductor component 300 is mounted on the circuit board, for example, the electrode 20 that is of the reference surface of the first EBG structure 12 is electrically connected to the ground surface of the printed wiring board. The electrode 50 that is of the reference surface of the second EBG structure is also connected to the ground surface of the printed wiring board, for example.

Sometimes the operating frequency of the semiconductor device 10 in the semiconductor component 300 differs from the operating frequency (transmission frequency) of the circuit board on which the semiconductor component 300 is mounted. In such cases, the frequency of the electromagnetic wave harmful to the operation of the semiconductor device 10 differs from the frequency of the electromagnetic wave harmful to the operation of the circuit board.

According to the second embodiment, the first EBG structure 12 cuts off the operating frequency (transmission frequency) of the circuit board 200 to act as the stop band filter that cuts off the frequency harmful to the operation of the circuit board 200. Additionally, the second EBG structure 42 cuts off the operating frequency of the semiconductor device 10 to act as the stop band filter that cuts off the frequency band harmful to the operation of the semiconductor device 10.

Accordingly, the stabilization of the operation and the downsizing of the circuit board can be achieved, and the stabilization of the operation of the semiconductor device 10 can also be achieved. The first EBG structure 12 and the second EBG structure 42 have functions of physically protecting the semiconductor device 10 and of cutting off the electromagnetic wave harmful to the semiconductor device 10. A metallic casing has the functions in the case that the semiconductor device 10 is covered with the metallic casing. Additionally, the first EBG structure has the function of cutting off the electromagnetic wave harmful to the circuit board.

The semiconductor component 300 of the second embodiment and the circuit board on which the semiconductor component 300 is mounted can cut off the electromagnetic waves harmful to the circuit boards inside and outside the semiconductor component.

The second EBG structure 42 may be connected to the power supply surface of the printed wiring board. Alternatively, for example, the first EBG structure may be connected to the power supply surface of the printed wiring board to stabilize the power supply of the circuit board, and the second EBG structure may be connected to the ground surface of the printed wiring board to stabilize the ground of the semiconductor device.

In the second embodiment, by way of example, the second EBG structure 52 has the via-less mosaic structure. Although desirably the second EBG structure 52 has the via-less mosaic structure from the viewpoint of simplifying the structure, other structures such as the mushroom structure may be used.

While certain embodiments have been described, these embodiments have been presented by way of example only, and are not intended to limit the scope of the inventions. Indeed, the electronic circuit and the semiconductor component described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A circuit board in which a plurality of electronic components is mounted on a printed wiring board, the circuit board comprising a semiconductor component mounted on the printed wiring board and the semiconductor component includes a semiconductor device and a first EBG structure formed on or above the semiconductor device, wherein an operating frequency of the semiconductor device exists outside a cutoff band of the first EBG structure, and the first EBG structure is connected to a ground or a power supply of the printed wiring board, wherein the first EBG structure has a mushroom structure including: an electrode made of a first conductor; a patch unit provided in substantially parallel with the electrode and made of a second conductor; an insulating layer provided between the electrode and the patch unit; and a via provided between the patch unit and the electrode in the insulating layer and connected to the patch unit and the electrode.

2. The circuit board according to claim 1, wherein the semiconductor component includes a second EBG structure between the first EBG structure and the semiconductor device, and
an operating frequency of the semiconductor device exists in a cutoff band of the second EBG structure.

3. The circuit board according to claim 2, wherein the first EBG structure is connected to the power supply of the printed wiring board, and the second EBG structure is connected to the ground of the printed wiring board.

4. The circuit board according to claim 1, wherein the operating frequency of the circuit board exists in the cutoff band of the first EBG structure.

5. The circuit board according to claim 1, wherein the semiconductor device is a pseudo SOC.

6. The circuit board according to claim 1, wherein the first conductor is aluminum (Al) or gold (Au), and the second conductor is aluminum (Al) or gold (Au).

7. The circuit board according to claim 1, wherein the semiconductor component is mounted such that the first EBG structure is located on the opposite side to the printed wiring board with respect to the semiconductor device.

8. An semiconductor component comprising: a semiconductor device; and a first EBG structure formed on or above the semiconductor device, wherein an operating frequency of the semiconductor device exists outside a cutoff band of the first EBG structure, wherein the first EBG structure has a mushroom structure, the mushroom structure including: an electrode made of a first conductor; a patch unit provided in substantially parallel with the electrode and made of a second conductor; an insulating layer provided between the electrode and the patch unit; and a via provided between the patch unit and the electrode in the insulating layer and connected to the patch unit and the electrode.

9. The semiconductor component according to claim 8, further comprising a second EBG structure located between the first EBG structure and the semiconductor device,
wherein the operating frequency of the semiconductor device exists in a cutoff band of the second EBG structure.

10. The semiconductor component according to claim 8, wherein the semiconductor device is a pseudo SOC.

11. The semiconductor component according to claim 1, wherein the first conductor is aluminum (Al) or gold (Au), and the second conductor is aluminum (Al) or gold (Au).

* * * * *